(12) United States Patent
Tranca et al.

(10) Patent No.: US 11,411,562 B2
(45) Date of Patent: Aug. 9, 2022

(54) ROBUST CURRENT SENSING DURING INVERSE CURRENT LOAD CONDITIONS

(71) Applicant: Infineon Technologies AG, Neubiberg (DE)

(72) Inventors: Ioan-Alexandru Tranca, Klagenfurt am Wörthesee (AT); Florian Brugger, Villach (AT); Alexander Mayer, Treffen (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 452 days.

(21) Appl. No.: 16/515,546

(22) Filed: Jul. 18, 2019

(65) Prior Publication Data
US 2021/0021269 A1   Jan. 21, 2021

(51) Int. Cl.
*H03K 19/094* (2006.01)
*H03F 3/45* (2006.01)
*G01R 19/00* (2006.01)
*H01L 29/78* (2006.01)

(52) U.S. Cl.
CPC ....... *H03K 19/094* (2013.01); *G01R 19/0092* (2013.01); *H03F 3/45475* (2013.01); *H01L 29/7803* (2013.01); *H03F 2203/45728* (2013.01)

(58) Field of Classification Search
CPC ............ G01R 19/0046; G01R 19/0092; H03K 19/094; H03F 2200/456; H03F 2203/45728
See application file for complete search history.

(56) References Cited

U.S. PATENT DOCUMENTS

| | | | |
|---|---|---|---|
| 7,659,706 B2* | 2/2010 | Nishida ................ | H03K 17/145 323/907 |
| 7,911,260 B2* | 3/2011 | Petruzzi ............. | H03K 17/0822 327/535 |
| 2005/0024909 A1* | 2/2005 | Kim ....................... | G11C 15/04 365/49.17 |
| 2012/0187930 A1* | 7/2012 | Williams .............. | G05F 1/5735 323/273 |
| 2018/0123578 A1* | 5/2018 | Chauhan .............. | H03K 17/687 |

* cited by examiner

*Primary Examiner* — Dominic E Hawkins
(74) *Attorney, Agent, or Firm* — Slater Matsil, LLP

(57) ABSTRACT

A current sensing circuit includes load transistors having a current path coupled between a power terminal and corresponding load terminals, sense transistors having a current path coupled between the power terminal and corresponding sense terminals, each sense transistor being coupled to a respective load transistor, N-channel transistors having a current path coupled between a respective sense transistor and a respective sense terminal, an amplifier for selectively equalizing the voltages across one of the load transistors and one of the sense transistors, and bypass circuits coupled to a bulk terminal of the N-channel transistors.

21 Claims, 11 Drawing Sheets

ROBUST CURRENT SENSING DURING INVERSE CURRENT LOAD CONDITIONS

TECHNICAL FIELD

The present invention relates generally to a system and method for robust current sensing during inverse current load conditions.

BACKGROUND

Replacing electromechanical relays with integrated circuit smart-power switches has been a trend within, for example, the automotive industry and for automotive body power applications in the last two decades. The smart-power switches are typically housed in a body control module that is the interface between a very noisy power supply network and sensitive loads that need to be protected under all circumstances. The smart-power switches must remain operational under harsh temperature and voltage conditions. In addition, the smart-power switches also must remain operational under certain load conditions that may seriously endanger the proper operation of the body control module.

SUMMARY

In accordance with an embodiment, a current sensing circuit comprises a plurality of load transistors having a current path coupled between a power terminal and a plurality of load terminals; a plurality of sense transistors having a current path coupled between the power terminal and a sense terminal, each sense transistor being coupled to a respective load transistor; a plurality of N-channel transistors having a current path coupled between a respective sense transistor and a respective sense terminal; an amplifier for selectively equalizing the voltages across one of the load transistors and one of the sense transistors; and a plurality of bypass circuits coupled to a bulk terminal of the plurality of N-channel transistors.

In accordance with another embodiment, a current sensing circuit comprises a plurality of load transistors having a current path coupled between a power terminal and a plurality of load terminals; a plurality of sense transistors having a current path coupled between the power terminal and a sense terminal, each sense transistor being coupled to a respective load transistor; a plurality of N-channel transistors having a current path coupled between a respective sense transistor and a respective sense terminal; an amplifier for selectively equalizing the voltages across one of the load transistors and one of the sense transistors; and a plurality of bypass circuits coupled to a bulk terminal of the plurality of N-channel transistors.

In another embodiment, a current sensing method comprises providing a load current in a first current path; sensing the load current to provide a sense current in a second current path; passing the sense current through an N-channel transistor in the second current path; and bypassing a parasitic current flowing out of a bulk terminal of the N-channel transistor so that it is not added to the sense current in the second current path.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Embodiment systems and methods address one of the critical load conditions of smart-power integrated switches, namely the operation during inverse current conditions and how inverse current conditions affect an important function of the integrated circuit switch, which is accurate load current sensing. Embodiment systems and methods minimize the possible errors seen by the system during, for example, a load current diagnosis phase of a multi-channel integrated switch while one or more of its channels are off but also under inverse current conditions. Cross-talk between channels of the integrated switch is overcome by implementing a current bypass circuit coupled to an inverse current sensitive N-channel transistor in the sensing current paths of the integrated switch. In an embodiment, the current bypass circuit comprises separating the bulk terminal from the source terminal of the N-channel transistor and coupling the bulk terminal to a local ground connection. In another embodiment, the current bypass circuit comprises a buffer amplifier coupled between the bulk terminal and the source terminal of the N-channel transistor.

Inverse current conditions can frequently occur for body control modules driving capacitive loads. For example, a capacitive load can be switched off and shortly thereafter, the automotive battery voltage can suffer a negative surge of at least some hundreds of millivolts.

Figure 1:
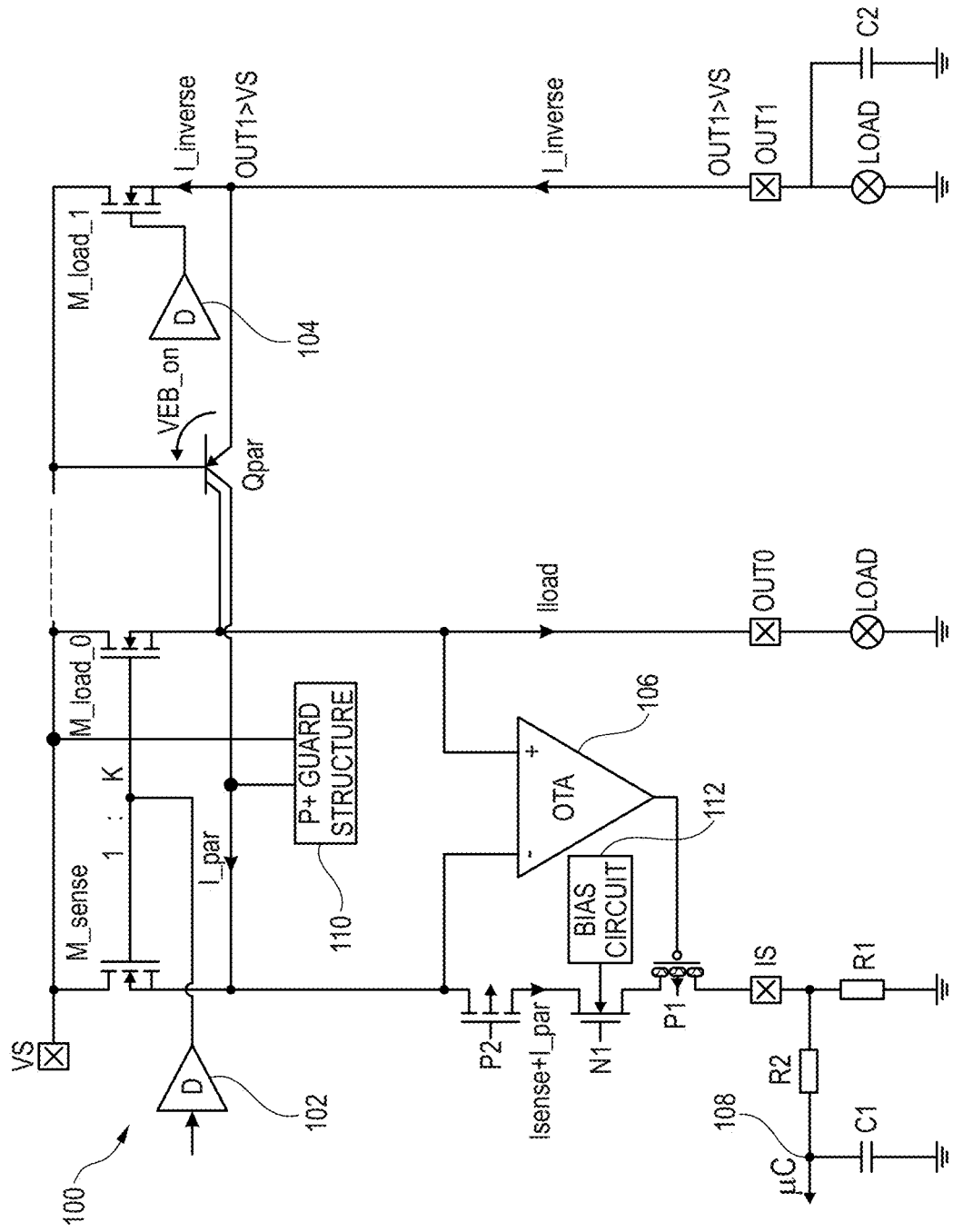
FIG. 1 is a schematic diagram of a current sensing circuit for a multi-channel power switch with inverse current protection according to an embodiment.

FIG. 1 is a schematic diagram of a sensing circuit with inverse current protection according to an embodiment including a multi-channel smart-power high-side switch device 100. The high-side switch device 100 can comprise an integrated circuit in an embodiment, comprising integrated circuit terminals or pins VS for receiving a power supply voltage, OUT0 for driving a load on a first channel, OUT1 for driving a load on a second channel, and IS for sensing a current on a selected channel. In an embodiment, high-side switch device can include a plurality of channels, for example, four or eight channels or more and the ability to selectively sense the current flowing through each channel.

Circuit 100 comprises a load transistor $M_{LOAD0}$ having a current path coupled between a power terminal VS and a load terminal OUT0. The load terminal OUT0 is coupled to an external load labeled LOAD. The load can be a resistive load. A sense transistor $M_{SENSE}$ has a current path coupled between the power terminal VS and a sense terminal IS. The sense terminal IS can be coupled to an external sensing resistor R1, which, in turn, is coupled to an external filter comprising resistor R2 and capacitor C1. The filter output node 108 can be coupled to processing circuitry such as a microprocessor. The control terminals or gates of transistors $M_{LOAD0}$ and $M_{SENSE}$ are coupled together. In FIG. 1, both the load transistor and the sense transistor are N-channel transistors. The load transistor $M_{LOAD0}$ can have an area of K times that of the sense transistor $M_{SENSE}$ such that the sensing current is only a fraction of the load current, wherein K is typically an integer. The load transistor $M_{LOAD0}$ and sense transistor $M_{SENSE}$ can be matched and scaled transistors in close proximity on an integrated circuit, or the sense transistor can be one or more cells of a larger load transistor including a greater plurality of transistor cells. A gate driver amplifier 102 can be used to provide an input signal for energizing the load transistor $M_{LOAD0}$ and the sense transistor $M_{SENSE}$. A P-channel transistor P1 has a current path coupled between the sense transistor $M_{SENSE}$ and the sense terminal IS. An amplifier 106 is used to equalize the drain-to-source voltages across the load transistor $M_{LOAD0}$ and the sense transistor $M_{SENSE}$. This is accomplished by having the positive input of amplifier 106 coupled to the source of the load transistor $M_{LOAD0}$, a negative input of amplifier 106 coupled to the source of the sense transistor $M_{SENSE}$, and having an output coupled to the control terminal (gate) of the P-channel transistor P1. FIG. 1 also includes an additional load transistor $M_{LOAD1}$ for a separate channel that is OFF and not currently being sensed, but may be subject to an inverse current condition. While only one separate channel is shown in FIG. 1, it will be appreciated by those skilled in the art that many such separate channels can be used. Load transistor $M_{LOAD1}$ is coupled between the power supply terminal VS and the load terminal OUT1. Load terminal OUT1 is also coupled to a load designated LOAD, which can also include a capacitive component comprising capacitor C2. A separate gate driver amplifier 104 is shown for driving load transistor $M_{LOAD1}$. The sensing circuitry for the additional switching channel is not shown in FIG. 1 and will be described in greater detail below, particularly with respect to the description of the circuit schematics shown in FIGS. 5 and 6.

The sensing circuitry for the first sensing channel includes P-channel transistor P2 for selectively coupling the sensing current $I_{SENSE}$ to the IS terminal in response to a multiplexing signal applied at the gate of transistor P2 (not shown in FIG. 1 and described in further detail below). The sensing circuitry for the first sensing channel also includes an inverse current sensitive N-channel transistor N1 having for selectively decoupling the sensing current $I_{SENSE}$ plus a parasitic current $I_{PAR}$ if an inverse current condition is detected in response to an inverse current signal applied at the gate of transistor N1 (not shown in FIG. 1 and described in further detail below). The decoupling action of transistor N1 prevents any parasitic current from passing through the IS terminal so that the sense current measurement value at node 108 remains accurate even during an inverse current condition on one of the channels that is not currently being sensed.

According to embodiments, the bulk or body node of N-channel transistor N1 is separated from the source terminal. Parasitic currents, which may be generated within an integrated circuit substrate of circuit 100 can be bypassed and advantageously directed through biasing circuit 112 and thus do not flow through the sensing pin IS.

In an embodiment, transistors P2, N1, and bias circuit 112 are specific to each channel in circuit 100. For example, if there are four switching channels in circuit 100, there will also be four channel specific sensing paths each including a copy of transistor P2, transistor N1, and bias circuit 112. In an embodiment, amplifier 106, transistor P1, sensing terminal IS, and external resistors R1, R2, and capacitor C1 are common to all sensing channels. In an embodiment, only one channel is selected for current sensing at a time. Current sensing can be performed, for example, during diagnostic tests during an initial mode of operation or can be performed periodically as may be required.

In the inverse current mode of operation one channel can be OFF and in the inverse current condition (for example at terminal OUT1) while the microcontroller reads the sense current data of a normally operating channel (for example at terminal OUT0). Note the normally flowing load current $I_{LOAD}$ flowing through load transistor $M_{LOAD0}$ and the inverse current $I_{INVERSE}$ flowing in the opposite direction through load transistor $M_{LOAD1}$. During the inverse current situation, while the OUT1 channel is in an OFF state, it can be observed that if the OUT1 voltage is high enough the emitter to base voltage ($VEB_{ON}$) of a lateral multi-collector PNP parasitic device ($Q_{PAR}$) will be activated and will draw current from the output terminal (OUT1). The activation of the $Q_{PAR}$ device is likely to occur if an inverse current condition occurs at one of the channels. The $Q_{PAR}$ emitter is defined by the bulk of the $M_{LOAD1}$ device (voltage>VS) while its base is built directly into the n-substrate (voltage=Vs). The emitter to base voltage $VEB_{ON}$ will be reached during inverse current operation in the OFF state. If the necessary $VEB_{ON}$ is achieved, a fraction of the inverse current flowing through the OUT1 pin ($I_{INVERSE}$) will be delivered proportionally to the $Q_{PAR}$ collectors ($I_{PAR}$), depending on their corresponding voltage levels. Since the current sensing is done selectively on each channel over the common pin, IS, having a channel in inverse current while the other is selected for diagnosis, the $Q_{PAR}$ device will inject current mainly into the shared sense line, therefore affecting the current read by the microcontroller on the nominally-operating channel. Note that the current flowing into the IS terminal includes the desired $I_{SENSE}$ current but also the undesired $I_{PAR}$ current, which would affect the accuracy of the sensed current data if not for the current bypassing function provided by bias circuit 112.

FIG. 1 also shows a P+ guard structure 110 that is formed in a substrate of integrated circuit 100 that is used to absorb parasitic currents generated during an inverse current condition. The P+ guard structure 110 is described in further detail below with respect to FIG. 2. The P+ guard structure 110 is shown in schematic form in FIG. 1 as being coupled between the collector of the parasitic transistor $Q_{PAR}$ and the power supply voltage terminal VS. While the P+ guard structure 110 can be advantageously coupled to ground, regulations regarding a maximum amount of ground current can sometimes prevent this implementation.

Figure 2:
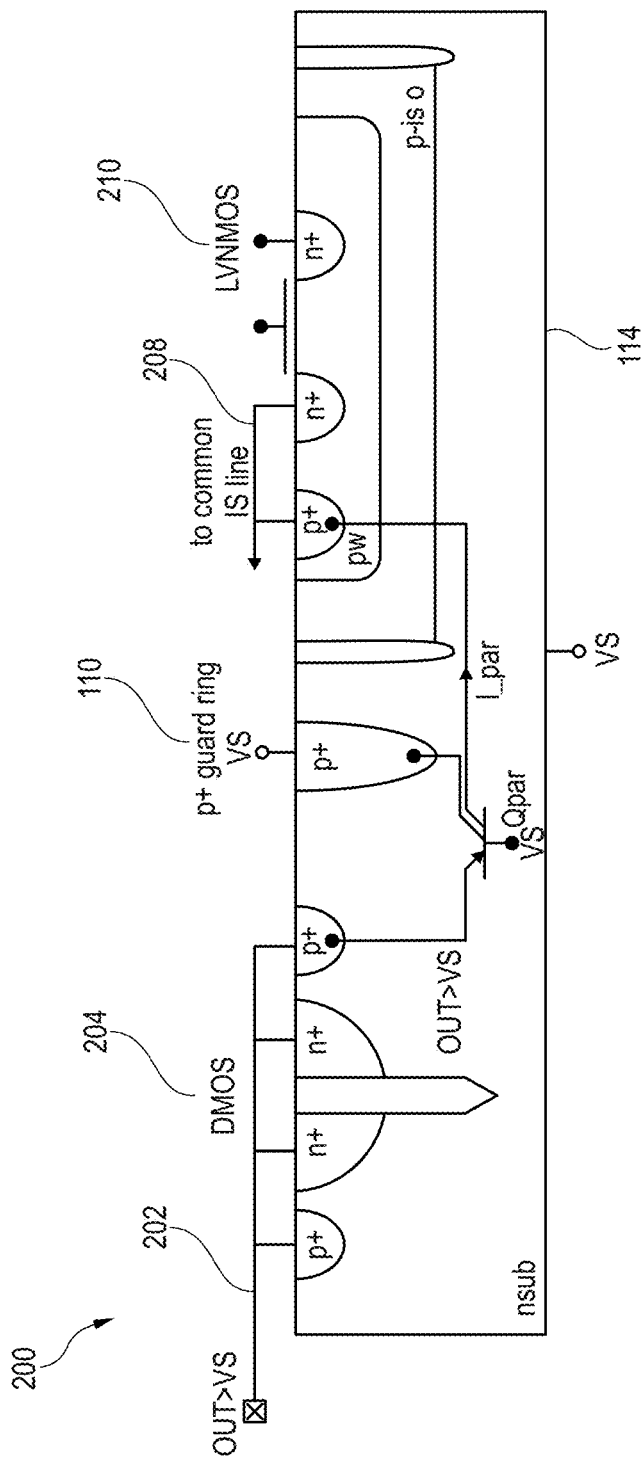
FIG. 2 is a cross-sectional view of a lateral multi-collector parasitic PNP device associated with the exemplary current sensing circuits.
Figure 5:
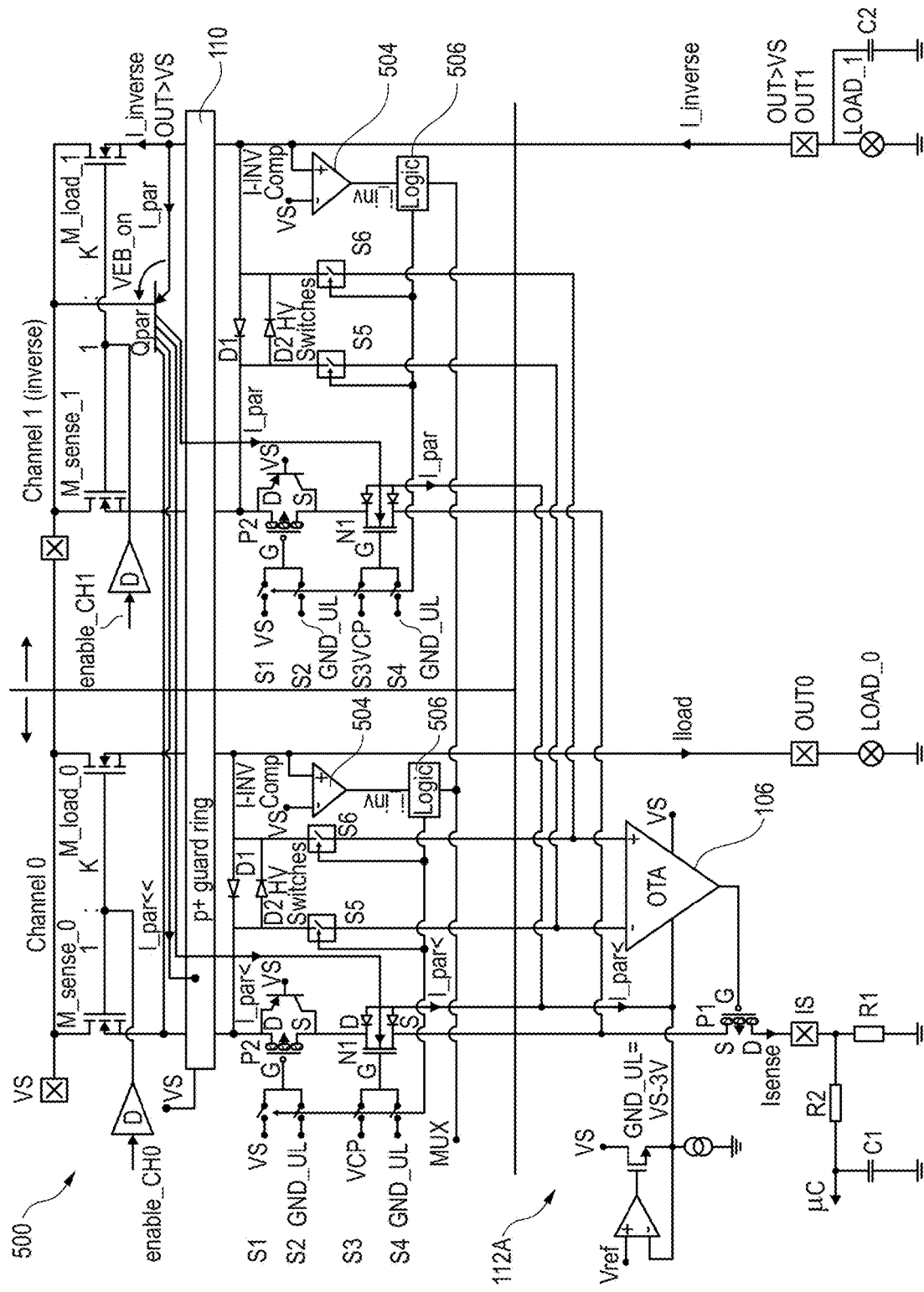
FIG. 5 is a detailed schematic diagram of the power switch of FIG. 1, according to an embodiment.
Figure 6:
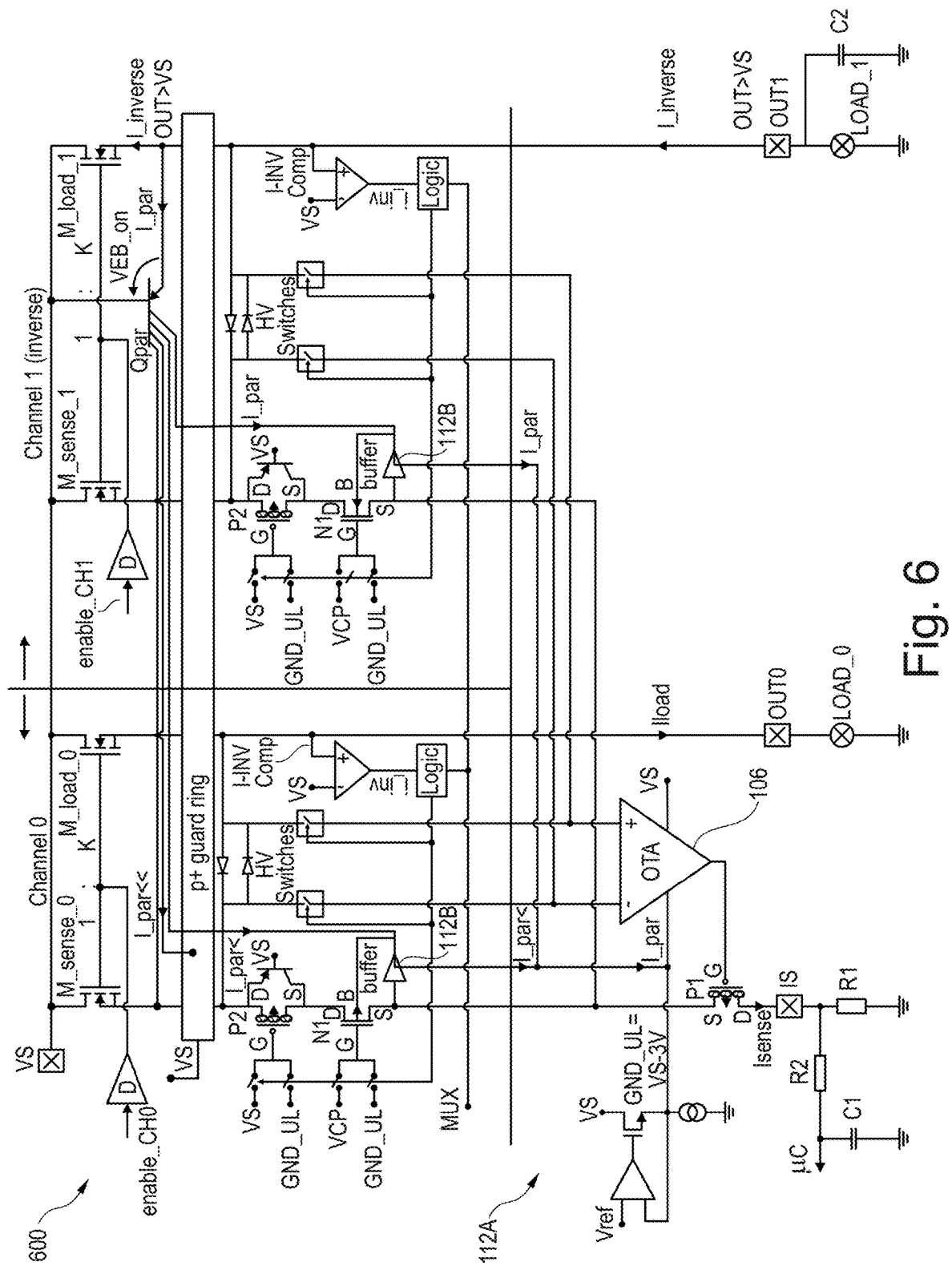
FIG. 6 is a detailed schematic diagram of the power switch of FIG. 1, according to another embodiment.

FIG. 2 is a cross-sectional view 200 of the $Q_{PAR}$ lateral multi-collector parasitic PNP device shown in schematic form in FIG. 1 in order to gain a further understanding of the nature of the parasitic currents flowing in the multi-channel current sensing circuit 100 and for providing a solution for preventing these parasitic currents flowing into the sensing circuitry portion of the current sensing circuit (the IS line or terminal). High voltage (DMOS) and low voltage (LVN-MOS) portions of the multi-channel sensing circuit 100 are integrated into a semiconductor substrate 114 in an embodiment. Cross-sectional view 200 includes a trenched gate DMOS device 204, which could represent one of the load transistors previously described, having a number of P+ regions coupled to an output pin 202. A cross-sectional view of the P+ guard ring or structure no is also shown in FIG. 2. P+ guard ring 110 is located in the proximity of DMOS transistor 204 and can be an actual ring shaped region encircling either the DMOS portion of the integrated circuit or the LVNMOS portion of the integrated circuit. Alternatively, the P+ structure can be a rectangular, striped, or other region or regions not in the shape of an enclosed ring. One of the low voltage LVNMOS transistors (for example transistor N1) 210 associated with the current sensing circuitry is also shown, having a number of P+ regions coupled to the IS line 208. Thus, the parasitic $Q_{PAR}$ transistor includes a flow of parasitic current between the emitter (one of the P+ regions of DMOS transistor 204) and one of the collectors not coupled to the guard ring 110 (one of the P+ regions of LVNMOS transistor 210). The base of parasitic $Q_{PAR}$ transistor is formed in the N-type substrate 114 (bulk) of the integrated circuit. The parasitic transistor $Q_{PAR}$ can actually have a number of parasitic collector paths to other P+ regions as is shown in FIGS. 5 and 6.

In order to avoid parasitic current injection into the IS line, the bulk of the N1 low-voltage NMOS device is separated from its source (the IS line). Embodiment biasing circuits for bypassing the current flowing out of the bulk node of transistor N1 are discussed below with respect to FIGS. 3A, 3B, 4A, and 4B.

Figure 3A:
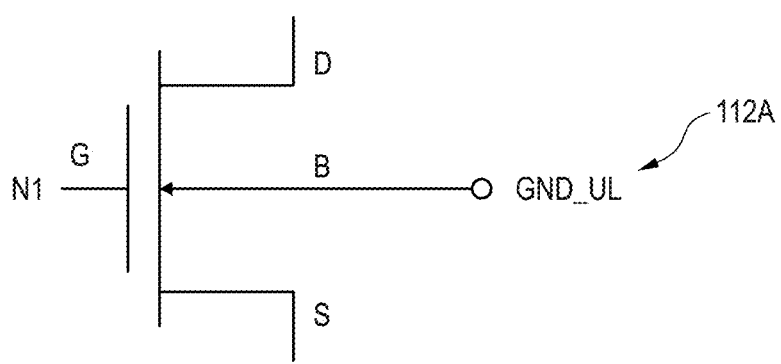
FIGS. 3A and 3B are schematic diagrams of a biasing circuit for use in the power switch of FIG. 1, according to an embodiment.

FIG. 3A illustrates an embodiment for biasing the bulk node of transistor N1 to a voltage lower than the VS power supply voltage. The transistor symbol for transistor N1 is labeled to identify the drain (D), gate (G), source (S), and bulk or body (B) nodes. Parasitic currents flowing out of the bulk node will thus flow into the bias voltage source and be bypassed from flowing through the source terminal and into the IS sensing terminal. A biasing voltage (local ground voltage) of $GND_{UL}$ is shown, which in an embodiment has a voltage of VS−3V. Numerous biasing circuits 112A can be used to provide the local ground voltage such as voltage regulators, charge pumps, voltage dividers, or a dedicated supply voltage.

Figure 3B:
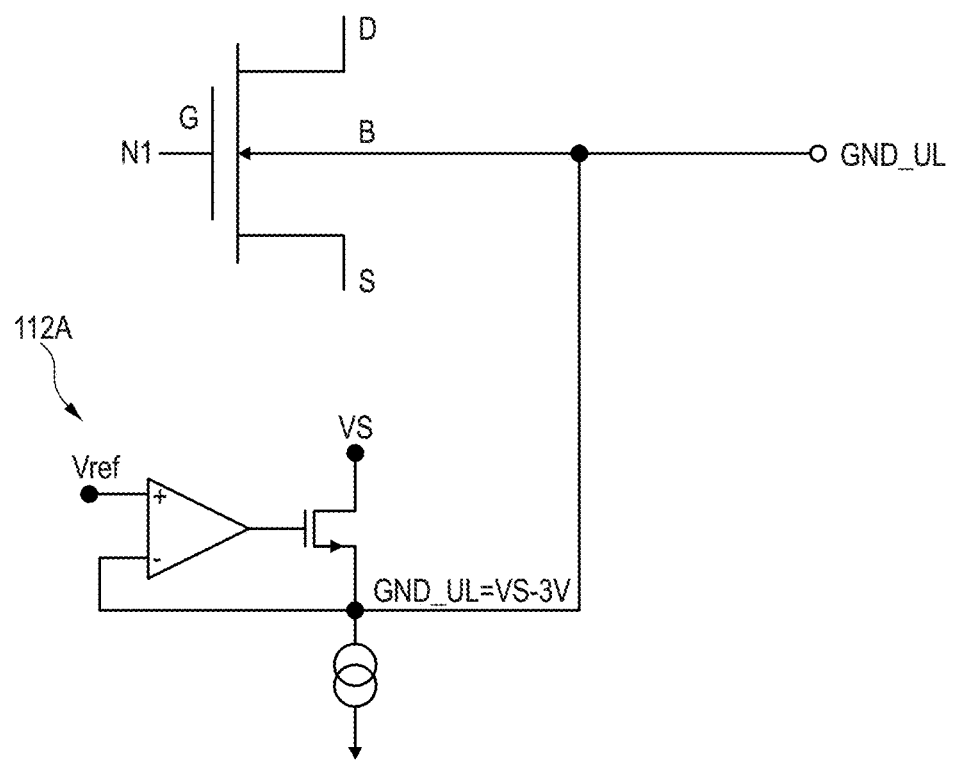

FIG. 3B illustrates a specific example of biasing circuit 112A, which is a voltage regulator that can be of conventional design including a reference voltage, operational amplifier, N-channel drive transistor, and a current source.

Figure 4A:
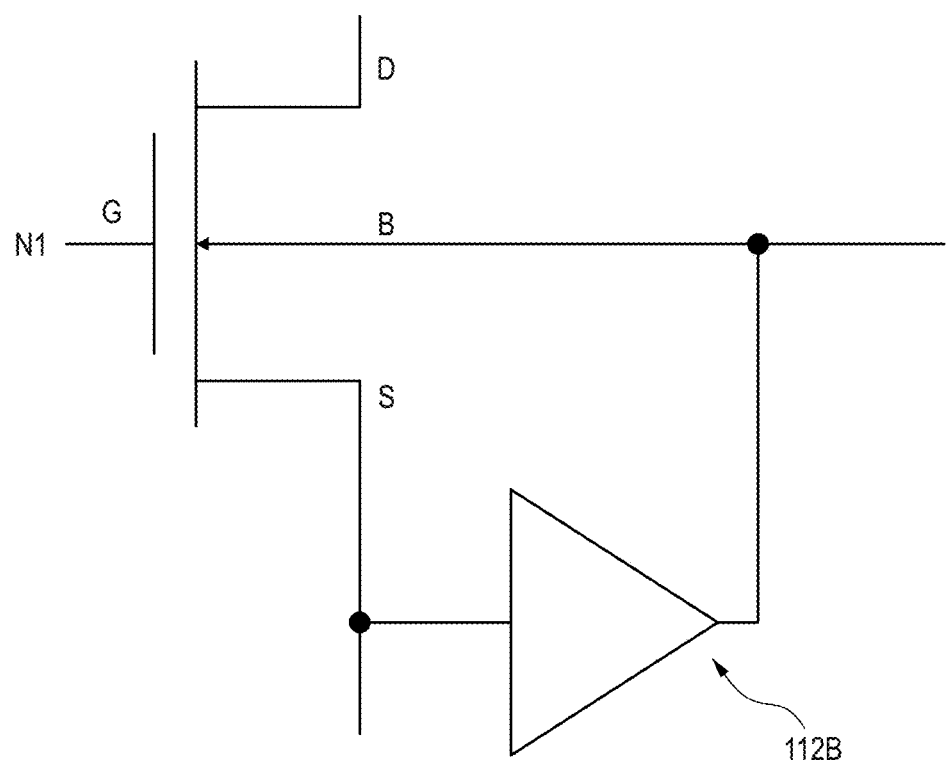
FIGS. 4A and 4B are schematic diagrams of a biasing circuit for use in the power switch of FIG. 1, according to another embodiment.

FIG. 4A illustrates an embodiment for biasing the bulk node of transistor N1 to a voltage substantially the same as the source voltage of transistor N1. Parasitic currents flowing out of bulk node will thus flow into the bias voltage source and be bypassed from flowing through the source of transistor N1 and into the IS sensing terminal. The input of a buffer amplifier 112B is coupled to the source node of transistor N1 and the output of buffer amplifier 112B is coupled to the bulk node of transistor N1. Numerous designs for buffer amplifier 112B can be used as long as a relatively high input impedance and a relatively low output impedance is presented.

Figure 4B:
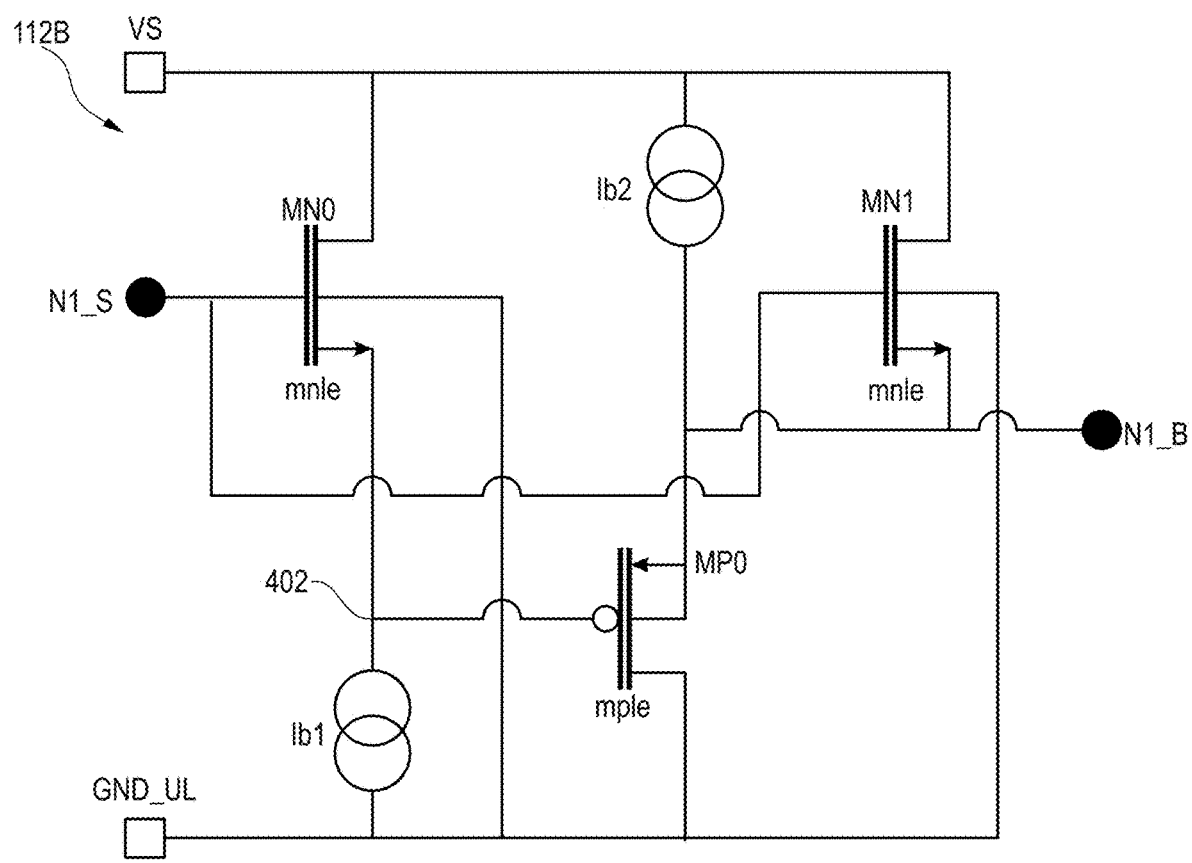

FIG. 4B illustrates a specific example of a buffer amplifier biasing circuit 112B including N-channel transistors MN0, MN1, P-channel transistor MP0, and biasing currents Ib1 and Ib2. The input of buffer amplifier 112B is node $N1_S$ and the output of buffer amplifier 112B is node $N1_B$. The positive power supply node of buffer amplifier 112B is coupled to the VS voltage and the negative power supply node of buffer amplifier 112B is coupled to the local ground voltage $GND_{UL}$.

One advantage of the buffer amplifier 112B depicted in FIG. 4B in replicating the source voltage of the N1 device at its bulk node is that there is no VGB violation (excessive VGB voltage) under any operating condition. The S-B buffer circuit 112B shown in FIG. 4B embeds two common drain stages (transistor MN0 and current source Ib1, and transistor MP0 and current source Ib2) which shift the N1 source-voltage once down (by $VGS_{MN0}$) and then once up (by $VGS_{MP0}$) in order to achieve, ideally, substantially the same N1 bulk-voltage as its source. The gate of transistor MN0 (the $N1_S$ input terminal) is coupled to the gate of transistor MN1.

The positive power supply terminal of buffer amplifier 112B is coupled to an intermediate power supply voltage VS, and the negative power supply terminal of buffer amplifier is coupled to the local ground voltage $GND_{UL}$ (which is typically −3V set by voltage regulator 112A shown for example in FIG. 3B).

The parasitic inverse current $I_{INVERSE}$ will thus be injected into the $N1_B$ output terminal and will flow to local ground $GND_{UL}$ over the MP0 device. The higher the injected current, the higher the $VGS_{MP0}$ becomes and therefore, the $N1_B$ output node will shift up accordingly. In an anomalous operating condition, a current could be forced out of the $N1_B$ node. In this case, the transistor MN1 advantageously clamps the $N1_B$ voltage at one VGS below $N1_S$ so that any $VGB_{N1}$ violation will be avoided. In normal operation, when there is no parasitic current disturbing the $N1_B$ node, the bulk of the N1 device will be fixed by the buffer to few hundreds of mV lower than its source. The B-S (bulk to source) diode of transistor N1 is therefore reverse biased and there is enough voltage head-room for the bulk to rise in case of an inverse current condition occurring.

The biasing circuits shown in FIGS. 3A and 3B are further illustrated in the detailed switching circuit schematic of FIG. 5. The biasing circuits shown in FIGS. 4A and 4B are further illustrated in the detailed switching circuit schematic of FIG. 6.

FIG. 5 is a schematic diagram of multi-channel current sensing circuit 500 with inverse current protection. Certain identification numerals of components described with respect to FIG. 1 are not replicated or described again in FIG. 5 for the sake of clarity.

Sensing circuit 500 includes a plurality of channels, two of which are shown in FIG. 5 (Channel 0 and Channel 1). Channel specific portions of circuit 500 include the load and sensing transistors previously described, and the multiplexing circuitry for transistors N1 and P2. Multiplexing circuitry includes switches S1, S2, S3, and S4. Switches S1 and S2 are used to selectively energize the gate of transistor P2 between the VS and $GND_{UL}$ voltages depending upon whether that particular channel is being sensed. Similarly, switches S3 and S4 are used to selectively energize the gate of transistor N1 between a charge pump voltage VCP (VS+3V) and $GND_{UL}$ (VS−3V) voltages depending upon whether an inverse current condition has been detected, in an embodiment. The logic signal for controlling switches S1, S2, S3, and S4 is provided by logic circuit 506, which is the logical combination of the $I_{INV}$ inverse current signal and the MUX multiplexing signals. The $I_{INV}$ signal, in turn, is generated by comparator 504. The positive input of comparator 504 is coupled to the respective output pin, such as OUT0 or OUT1 and the negative input of comparator 504 is coupled to the VS supply voltage. If the voltage at the output pin is greater than the VS supply voltage, the $I_{INV}$ signal is generated at the output of comparator 504, which is combined with the MUX signal in logic circuitry 506. Channel specific multiplexing circuitry also includes high voltage switches S5 and S6, which are also coupled to logic circuit 506. Switch S5 selectively couples the negative input of operational amplifier 106 to the corresponding sense transistor in the selected channel. Switch S6 selectively couples the positive input of operational amplifier 106 to the corresponding load transistor in the selected channel. Channel specific multiplexing circuitry also includes diodes D1 and D2 prevent the voltage across the selected sense and load transistors, as well as the voltages across the inputs of amplifier 106 from diverging by more or less than one diode voltage drop.

Common circuitry shared by each of the channels in circuit 500 shown in FIG. 5 includes voltage regulator 112A, operational amplifier 106, the IS sense terminal, sense resistor R1, external filtering circuitry including resistor R2 and capacitor C1, and P+ guard ring 110.

Note that in FIG. 5 the bulk node of each N1 transistor in each channel is biased by the output of voltage regulator 112A, which provides the local ground voltage $GND_{UL}$. The parasitic current $I_{PAR}$ associated with the bulk node of transistor N1 during for example an inverse current condition thus flows in to the voltage regulator and not into the IS terminal, thus assuring that sense current measurements remain accurate during the inverse current condition. In an embodiment, each transistor N1 comprises an MVNMOS (medium voltage N-channel MOS) device, which can advantageously withstand a higher VGB (gate to bulk voltage).

Switching circuit 600 of FIG. 6 includes the same channel specific multiplexing circuitry, the same common circuitry, and the same load and sense transistors as those shown in switching circuit 500 shown in FIG. 5. Thus, the description of those components and features are not described again with respect to FIG. 6 and some of the identifying numerals are omitted for clarity.

However, it is important to note that in FIG. 6 the bulk node of each N1 transistor in each channel is biased by an output of a respective buffer amplifier 112B, whose input is coupled to the source node of transistor N1. The negative supply voltage of buffer amplifier 112B is provided by the output of voltage regulator 112A, which is the local ground voltage $GND_{UL}$ (VS−3V). The parasitic current $I_{PAR}$ associated with the bulk node of transistor N1 during for example an inverse current condition thus flows in to the output of buffer amplifier 112B, and in to the voltage regulator 112A and not into the IS terminal, thus assuring that sense current measurements remain accurate during the inverse current condition.

Figure 7:
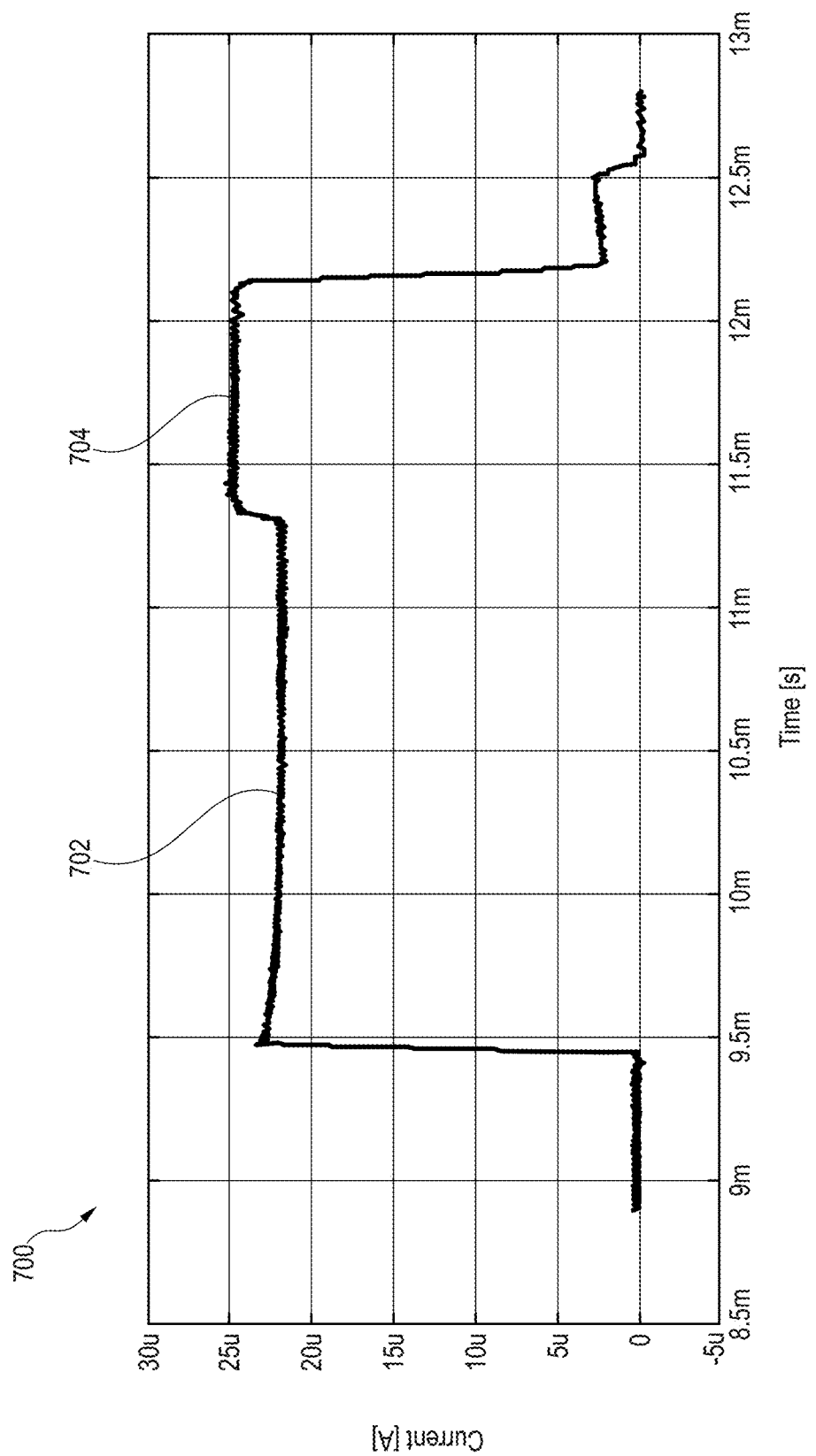
FIG. 7 is a graph of sense current before and after an inverse current condition using a prior art sensing circuit.

FIG. 7 shows the value of the sense current 700 in a prior art sensing circuit not including the bypass features and circuits described herein. Note that during a normal operating condition 702, the sensing current has a value midway between 20 μA and 25 μA. During an inverse operating condition 704, the sensing current increases to a value of about 25 μA. The extra sensing current represents an error current caused by at least a portion of the parasitic current that in turn is caused by the inverse operating condition entering in to the sensing circuitry.

Figure 8:
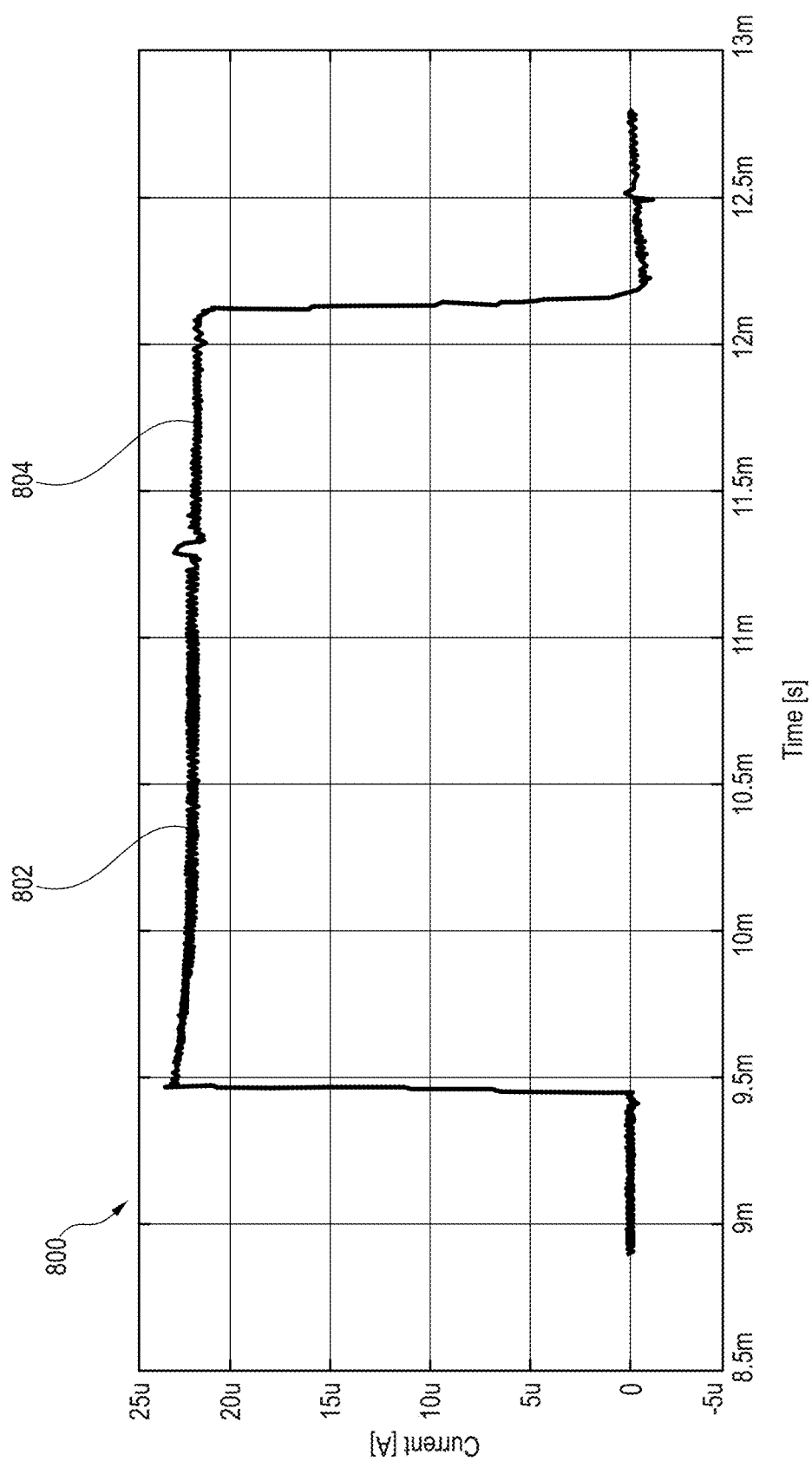
FIG. 8 is a graph of sense current before and after an inverse current condition using a sensing circuit according to embodiments.

FIG. 8 shows the value of the sense current 800 in embodiment sensing circuits including the bypass features and circuits described herein. Note that during a normal operating condition 802, the sensing current has a value midway between 20 μA and 25 μA. During an inverse operating condition 804, the sensing current has not changed and maintains the value midway between 20 μA and 25 μA. The same sensing current during both operating conditions demonstrates that the parasitic current caused by the inverse operating condition is bypassed and prevented from entering in to the sensing circuitry. Thus, an accurate representation of the sensed channel current is achieved, even though one or more of the additional unselected channels may be in an inverse current condition.

Figure 9:
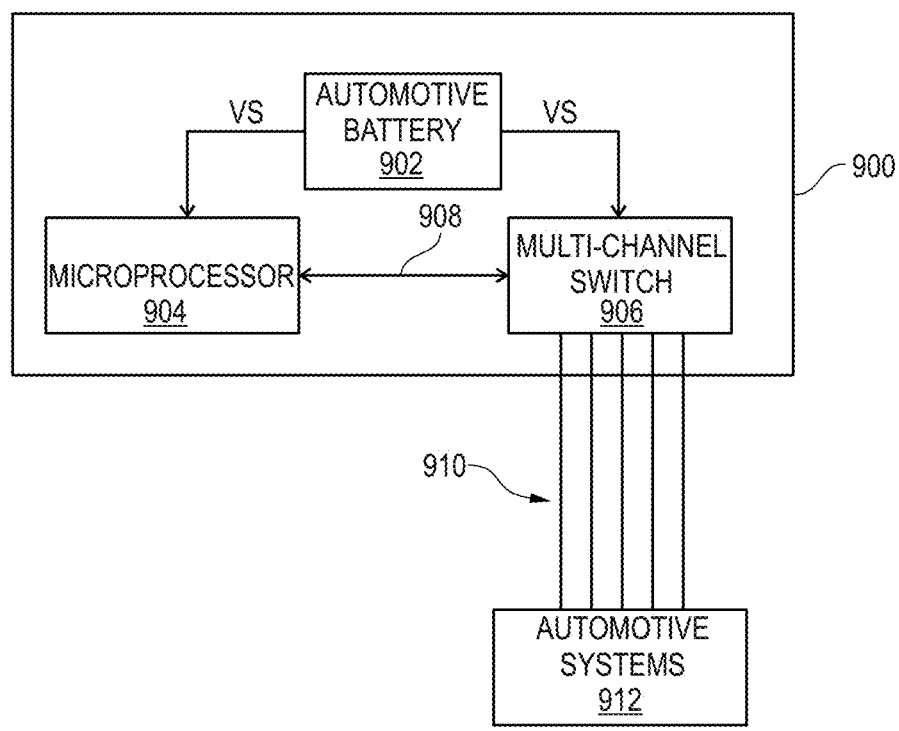
FIG. 9 is a block diagram of a body control module in an automotive application including a sensing circuit according to embodiments.

FIG. 9 illustrates a representative body control module 900 including a multi-channel switch 900 including the accurate current sensing features described herein. An automotive battery 902 provides the power supply voltage VS to both a microprocessor 904 and the multi-channel switch 906. Battery 902 can be external to the body control module, in an embodiment. The microprocessor 904 is in communication with the multi-channel switch 906 through a digital bus 908. Multi-channel switch 906 can be a high voltage integrated circuit including a plurality of channels 910 coupled to various electrical automotive systems 912. Some of these automotive systems can be loads that are capacitive in nature potentially causing an inverse current condition on one or more of the plurality of channels 910.

In summary, embodiment circuits and methods are described herein for assuring that an integrated multi-channel switching circuit including a multi-channel sensing function provides an accurate current sensing function even if one of the channels of the switching circuit are subject to an inverse current condition that generates internal parasitic currents within the integrated circuit.

Example embodiments of the present invention are summarized here. Other embodiments can also be understood from the entirety of the specification and the claims filed herein.

EXAMPLE 1

A current sensing circuit comprises a load transistor having a current path coupled between a power terminal and a load terminal, and a control terminal; a sense transistor having a current path coupled between the power terminal and a sense terminal, and a control terminal coupled to the control terminal of the load transistor; a P-channel transistor having a current path coupled between the sense transistor and the sense terminal, and a control terminal; an N-channel transistor having a current path coupled between the sense transistor and the sense terminal, and a control terminal for receiving a control voltage; an amplifier for equalizing the voltages across the load transistor and the sense transistor, having an output coupled to the control terminal of the P-channel transistor; and a bypass circuit coupled to a bulk terminal of the N-channel transistor.

EXAMPLE 2

The current sensing circuit of example 1, wherein the bypass circuit comprises a local ground connection.

EXAMPLE 3

The current sensing circuit of any preceding example, wherein the bypass circuit comprises a voltage regulator.

EXAMPLE 4

The current sensing circuit of any preceding example, wherein the bypass circuit comprises a buffer amplifier coupled between the bulk terminal of the N-channel transistor and a source terminal of the N-channel transistor.

EXAMPLE 5

The current sensing circuit of any preceding example, wherein the bypass circuit comprises a buffer coupled between the power terminal and a local ground connection.

EXAMPLE 6

The current sensing circuit of any preceding example, wherein the buffer amplifier comprises a first N-channel transistor in series with a first current source coupled between the power terminal and a local ground connection; a P-channel transistor in series with a second current source coupled between the power terminal and the local ground connection; and a second N-channel transistor coupled to the first N-channel transistor and the P-channel transistor.

EXAMPLE 7

The current sensing circuit of any preceding example, wherein a gate of the first N-channel transistor comprises an input of the buffer amplifier, and a source of the second N-channel transistor comprises an output of the buffer amplifier.

EXAMPLE 8

The current sensing circuit of any preceding example, wherein a bulk terminal of the first and second N-channel transistors is coupled to the local ground connection.

EXAMPLE 9

The current sensing circuit of any preceding example, wherein a bulk terminal of the N-channel transistor is coupled to a source terminal of the N-channel transistor.

EXAMPLE 10

The current sensing circuit of any preceding example, further comprising an integrated substrate including a P-type guard structure proximate to the sense transistor and the load transistor.

EXAMPLE 11

The current sensing circuit of any preceding example, further comprising an additional P-channel transistor having a current path coupled between the sense transistor and the sense terminal.

EXAMPLE 12

A current sensing circuit comprising a plurality of load transistors having a current path coupled between a power terminal and a plurality of load terminals; a plurality of sense transistors having a current path coupled between the power terminal and a sense terminal, each sense transistor being coupled to a respective load transistor; a plurality of N-channel transistors having a current path coupled between a respective sense transistor and a respective sense terminal; an amplifier for selectively equalizing the voltages across one of the load transistors and one of the sense transistors; and a plurality of bypass circuits coupled to a bulk terminal of the plurality of N-channel transistors.

EXAMPLE 13

The current sensing circuit of example 12, wherein each of the plurality of bypass circuits comprises a local ground connection.

EXAMPLE 14

The current sensing circuit of any preceding example, wherein each of the plurality of bypass circuits comprises a voltage regulator.

EXAMPLE 15

The current sensing circuit of any preceding example, wherein each of the bypass circuits comprises a buffer amplifier coupled between the bulk terminal of a respective N-channel transistor and a source terminal of the respective N-channel transistor.

EXAMPLE 16

The current sensing circuit of any preceding example, wherein each of the bypass circuits is further coupled to a local ground connection.

EXAMPLE 17

A current sensing method, the method comprising providing a load current in a first current path; sensing the load current to provide a sense current in a second current path; passing the sense current through an N-channel transistor in the second current path; and bypassing a parasitic current flowing out of a bulk terminal of the N-channel transistor so that it is not added to the sense current in the second current path.

EXAMPLE 18

The current sensing method of example 17, wherein bypassing the parasitic current comprises shunting the parasitic current to a local ground connection.

EXAMPLE 19

The current sensing method of any preceding example, wherein bypassing the parasitic current comprises shunting the parasitic current to a voltage regulator.

EXAMPLE 20

The current sensing method of any preceding example, wherein bypassing the parasitic current comprises shunting the parasitic current to an output of a buffer amplifier coupled between the bulk terminal of the N-channel transistor and a source terminal of the N-channel transistor.

EXAMPLE 21

The current sensing method of any preceding example, wherein the buffer amplifier is further coupled to a local ground connection.

Specific transistor types and polarities have been described herein, but can be changed in embodiments. For example, while transistor N1 has been described as an N-channel transistor, circuit embodiments can replace transistor N1 with a P-channel transistor. Also, specific sensing current values have also been described herein, but these current sensing current values can be adjusted up or down to suit a particular application. The area ratio K between the sensing transistors and the load transistors can also be changed as desired. Other current mirror type circuits can be used to connect the sensing transistor to the load transistor. Power supply voltages will vary over voltage ranges in order to match the corresponding transistor technology used in embodiment circuits. Other similar such changes can be made to accommodate a specific implementation while still benefiting from the embodiment current sensing concepts described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current sensing circuit comprising:
   a load transistor having a current path coupled between a power terminal and a load terminal, and a control terminal;
   a sense transistor having a current path coupled between the power terminal and a sense terminal, and a control terminal coupled to the control terminal of the load transistor;
   a P-channel transistor having a current path coupled between the sense transistor and the sense terminal, and a control terminal;
   an N-channel transistor having a current path coupled between the sense transistor and the sense terminal, and a control terminal for receiving a control voltage;
   an amplifier for equalizing the voltages across the load transistor and the sense transistor, having an output coupled to the control terminal of the P-channel transistor; and
   a bypass circuit directly connected to a bulk terminal of the N-channel transistor, and wherein the bulk terminal of the N-channel transistor is separate from a source terminal of the N-channel transistor.

2. The current sensing circuit of claim 1, wherein the bypass circuit comprises a local ground connection.

3. The current sensing circuit of claim 1, wherein the bypass circuit comprises a voltage regulator.

4. The current sensing circuit of claim 1, wherein the bypass circuit comprises a buffer amplifier coupled between the bulk terminal of the N-channel transistor and the source terminal of the N-channel transistor.

5. The current sensing circuit of claim 4, wherein the buffer amplifier comprises:
   a first N-channel transistor in series with a first current source coupled between the power terminal and a local ground connection;
   a P-channel transistor in series with a second current source coupled between the power terminal and the local ground connection; and
   a second N-channel transistor coupled to the first N-channel transistor and the P-channel transistor.

6. The current sensing circuit of claim 5, wherein a gate terminal of the first N-channel transistor comprises an input of the buffer amplifier, and a source terminal of the second N-channel transistor comprises an output of the buffer amplifier.

7. The current sensing circuit of claim 5, wherein a bulk terminal of the first and second N-channel transistors is coupled to a local ground connection.

8. The current sensing circuit of claim 1, wherein the bulk terminal of the N-channel transistor is coupled to the source terminal of the N-channel transistor through the bypass circuit.

9. The current sensing circuit of claim 1, wherein the bypass circuit comprises a buffer coupled between the power terminal and a local ground connection.

10. The current sensing circuit of claim 1, further comprising an integrated substrate including a P-type guard structure proximate to the sense transistor and the load transistor.

11. The current sensing circuit of claim 1, further comprising an additional P-channel transistor having a current path coupled between the sense transistor and the sense terminal.

12. A current sensing circuit comprising:
   a plurality of load transistors having a current path coupled between a power terminal and a plurality of load terminals;
   a plurality of sense transistors having a current path coupled between the power terminal and a sense terminal, each sense transistor being coupled to a respective load transistor;
   a plurality of N-channel transistors having a current path coupled between a respective sense transistor and a respective sense terminal;
   an amplifier for selectively equalizing the voltages across one of the load transistors and one of the sense transistors; and
   a plurality of bypass circuits coupled to a bulk terminal of the plurality of N-channel transistors.

13. The current sensing circuit of claim 12, wherein each of the plurality of bypass circuits comprises a local ground connection.

14. The current sensing circuit of claim 12, wherein each of the plurality of bypass circuits comprises a voltage regulator.

15. The current sensing circuit of claim 12, wherein each of the bypass circuits comprises a buffer amplifier coupled between the bulk terminal of a respective N-channel transistor and a source terminal of the respective N-channel transistor.

16. The current sensing circuit of claim 12, wherein each of the bypass circuits is further coupled to a local ground connection.

17. A current sensing method, the method comprising:
   providing a load current in a first current path;
   sensing the load current to provide a sense current in a second current path;
   passing the sense current through an N-channel transistor in the second current path; and bypassing a parasitic current flowing out of a bulk terminal of the N-channel transistor so that it is not added to the sense current in the second current path, wherein the parasitic current is bypassed through a bypass circuit directly coupled to the bulk terminal, and wherein the bulk terminal of the N-channel transistor is separate from a source terminal of the N-channel transistor.

18. The current sensing method of claim 17, wherein bypassing the parasitic current comprises shunting the parasitic current to a local ground connection of the bypass circuit.

19. The current sensing method of claim 17, wherein bypassing the parasitic current comprises shunting the parasitic current to a voltage regulator of the bypass circuit.

20. The current sensing method of claim 17, wherein bypassing the parasitic current comprises shunting the parasitic current to an output of a buffer amplifier of the bypass circuit, wherein the buffer amplifier is coupled to the source terminal of the N-channel transistor.

21. The current sensing method of claim 20, wherein the buffer amplifier is further coupled to a local ground connection.

\* \* \* \* \*